United States Patent
Nakamura (10) Patent No.: US 10,755,767 B2
(45) Date of Patent: Aug. 25, 2020

(54) SENSE AMPLIFIERS FOR WIDER I/O MEMORY DEVICE

(71) Applicant: INTERNATIONAL BUSINESS MACHINES CORPORATION, Armonk, NY (US)

(72) Inventor: Yutaka Nakamura, Kyoto (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/248,886

(22) Filed: Jan. 16, 2019

(65) Prior Publication Data

US 2020/0227110 A1    Jul. 16, 2020

(51) Int. Cl.
G11C 11/4074    (2006.01)
G11C 11/4091    (2006.01)
G11C 11/4096    (2006.01)

(52) U.S. Cl.
CPC ...... *G11C 11/4091* (2013.01); *G11C 11/4074* (2013.01); *G11C 11/4096* (2013.01)

(58) Field of Classification Search
CPC ............ G11C 11/4074; G11C 11/4096
USPC .......................................... 365/205
See application file for complete search history.

(56) References Cited

U.S. PATENT DOCUMENTS

| | | | | |
|---|---|---|---|---|
| 6,552,943 B1* | 4/2003 | Hardee | ............... | G11C 7/065 365/149 |
| 7,263,016 B1* | 8/2007 | Palumbo | ............... | G11C 7/065 327/57 |
| 2002/0093032 A1* | 7/2002 | Hanzawa | ............... | G11C 7/14 257/200 |
| 2004/0124440 A1* | 7/2004 | Takemura | ............... | G11C 11/4076 257/200 |
| 2004/0155682 A1* | 8/2004 | Sato | ............... | G11C 7/062 327/65 |
| 2004/0264276 A1 | 12/2004 | Asano et al. | | |
| 2005/0237835 A1* | 10/2005 | Hung | ............... | G11C 7/065 365/207 |
| 2008/0159042 A1* | 7/2008 | Bertin | ............... | B82Y 10/00 365/225.7 |
| 2011/0035644 A1* | 2/2011 | Madan | ............... | G06F 11/1048 714/758 |
| 2017/0084314 A1 | 5/2017 | Fritsch et al. | | |
| 2017/0236560 A1* | 8/2017 | Matsui | ............... | G11C 11/4085 365/203 |

OTHER PUBLICATIONS

R'Ang et al., A Low-Power Low-Swing Single-Ended Multi-Port SRAM, 2007 International Symposium on VLSI Design, Automation and Test (VLSI-DAT), Jun. 18, 2007, IEEE.*

(Continued)

*Primary Examiner* — Hoai V Ho
*Assistant Examiner* — Muna A Techane
(74) *Attorney, Agent, or Firm* — Tutunjian & Bitetto, P.C.; Vazken Alexanian (57) ABSTRACT

A sense amplifier includes a first transistor having a source/drain connected to a data line, a drain/source connected to a first node and a gate connected to a setting line. The sense amplifier further includes a second transistor having a source/drain connected to ground or a power supply voltage, a drain/source connected to a second node and a gate connected to the setting line.

19 Claims, 7 Drawing Sheets

(56) References Cited

OTHER PUBLICATIONS

Yang et al., A Low-Power Low-Swing Single-Ended Multi-Port SRAM, 2007 International Symposium on VLSI Design, Automation and Test (VLSI-DAT), Jun. 18, 2007, IEEE.
Noh et al., A new dual asymmetric bit-line sense amplifier for low-voltage dynamic random access memory, IEICE Electronics Express, Aug. 30, 2013, pp. 1-6, vol. 10, No. 18, IEICE.
Barth et al, Embedded DRAM design and architecture for the IBM 0.11-um ASIC offering, IBM J. Res & Dev, Nov. 2002, pp. 676-689, vol. 46 No. 6.
Nirmalraj et al, Low Power and Improved Speed 1T DRAM Using Dynamic Logic, Journal of Engineering Science and Technology, Jun. 2018, pp. 1636-1650, vol. 13, No. 6, School of Engineering, Taylor's University.

* cited by examiner

SENSE AMPLIFIERS FOR WIDER I/O MEMORY DEVICE

BACKGROUND

Technical Field

The present invention generally relates to semiconductor devices, and more particularly to sense amplifiers for wider I/O memory devices.

Description of the Related Art

In the context of computer memory, sense amplifiers are components of read circuitry on a memory chip used to read data from memory. Sense amplifiers are configured to sense low power signals from a bit-line representing a data bit (e.g., 1 or 0) stored in a memory cell, and amplify the small voltage to recognizable logical levels so that the data can be interpreted by logic.

SUMMARY

In accordance an embodiment of the present invention, a sense amplifier is provided. The sense amplifier includes a first transistor having a source/drain connected to a data line, a drain/source connected to a first node and a gate connected to a setting line. The sense amplifier further includes a second transistor having a source/drain connected to ground or a power supply voltage, a drain/source connected to a second node and a gate connected to the setting line.

In accordance another embodiment of the present invention, a memory device is provided. The memory device include a memory cell allocated to a sub-array, a sense amplifier provided for the sub-array and connected to a bit-line pair, and a data line provided for the sub-array and connected to an output of the sense amplifier. The sense amplifier includes a first transistor having a source/drain connected to a data line, a drain/source connected to a first node and a gate connected to a setting line. The sense amplifier further includes a second transistor having a source/drain connected to ground or a power supply voltage, a drain/source connected to a second node and a gate connected to the setting line.

In accordance yet another embodiment of the present invention, a method for implementing a sense amplifier is provided. The method includes sensing, by a sense amplifier provided for a sub-array and connected to a bit-line pair and a data line of a memory device, a signal. The method further includes amplifying, by the sense amplifier, the sensed signal. The sense amplifier includes a first transistor having a source/drain connected to a data line, a drain/source connected to a first node and a gate connected to a setting line. The sense amplifier further includes a second transistor having a source/drain connected to ground or a power supply voltage, a drain/source connected to a second node and a gate connected to the setting line.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

One factor that can be considered in manufacturing semiconductor devices is chip size (e.g., chips per wafer). In the context of memory devices, the cell array area can be over half in memory chip. The embodiments described herein provide for sense amplifiers for wider I/O memory devices. For example, the sense amplifiers described herein can be implemented as primary sense amplifiers (PSAs) and/or secondary sense amplifiers (SSAs) in memory devices (e.g., DRAM or SRAM). The embodiments described herein can be used to minimize memory cell size for reducing cost, and maximize bandwidth to read all PSA outputs from activated sub-arrays without waste.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
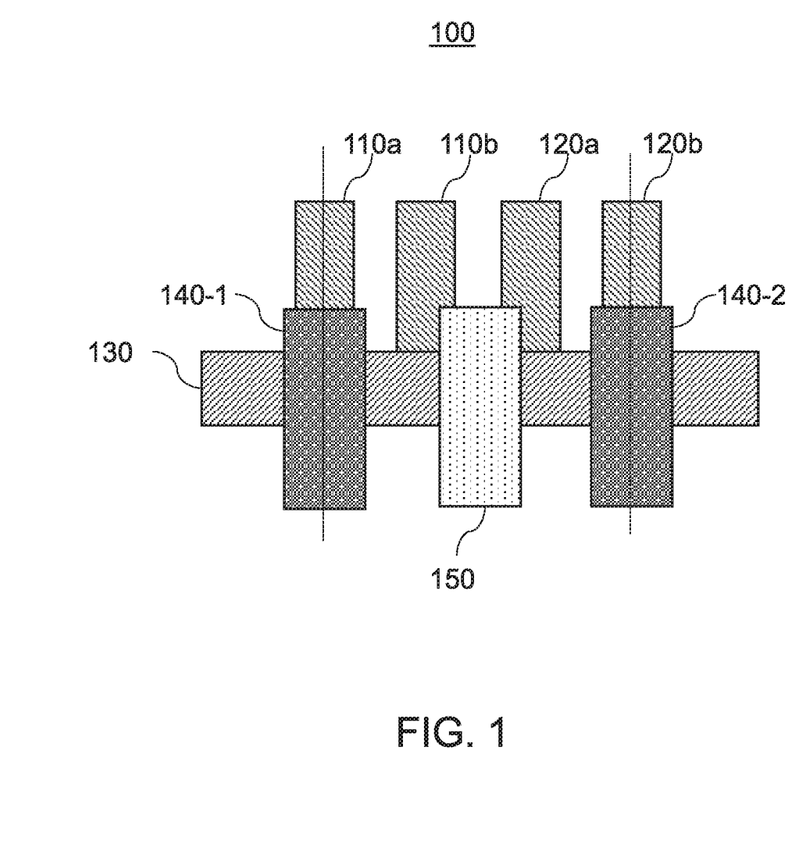
FIG. 1 is a block diagram of a memory cell, in accordance with an embodiment of the present invention.

With reference to FIG. 1, a memory cell 100 is shown. In one embodiment, the memory cell 100 includes dynamic RAM (DRAM) cell. For example, the memory cell 100 can illustratively employ a DRAM memory cell design having a storage cell size of $6F^2$, where F refers to the feature of the semiconductor device manufacturing technology (e.g., 90/65/28 nm). Thus, $F^2$ is the square of the feature, which is a minimum unit size of the manufacturing technology. However, the memory cell 100 can include any suitable memory cell in accordance with the embodiments described herein.

The memory cell 100 includes pairs of bit-lines (BLs) and complementary bit-lines (*BLs), including a first pair having a first BL 110*a* and a first *BL 110*a*, and a second pair having a second BL 120*a* and a second *BL 120*b*. The memory cell 100 further includes word-line (WL) 130, a first data-line (DL) 140-1, a second DL 140-2 and power supply voltage (VDD)/ground (GND) 150.

Generally, a lowest level metal (e.g., M1) can be assigned to the BLs/*BLs, and a highest level metal (e.g., M3) can be assigned to the DLs. The higher level metal pitch can be bigger as compared to the lower level metal pitch. The cell size, and thus cost of memory, can be reduced by tightening the BL/WL pitch. Therefore, the same number of BL/DL cannot be allocated, further no wires cannot be allocated for VDD/GND.

A primary sense amplifier (PSA) (not shown) can be attached to each BL pair selected by the WL 130, which data cannot be transferred through DL pairs. Therefore, a secondary sense amplifier (SSA) (not shown) working with single-ended DL can be needed. However, this constraint doesn't occur if the memory cell 100 includes SRAM. For example, since the cell size is much larger compared to DRAM, then it can be possible to allocate enough wires. Further details regarding memory architectures including PSAs and SSAs will now be described below with reference to FIG. 2.

Figure 2:
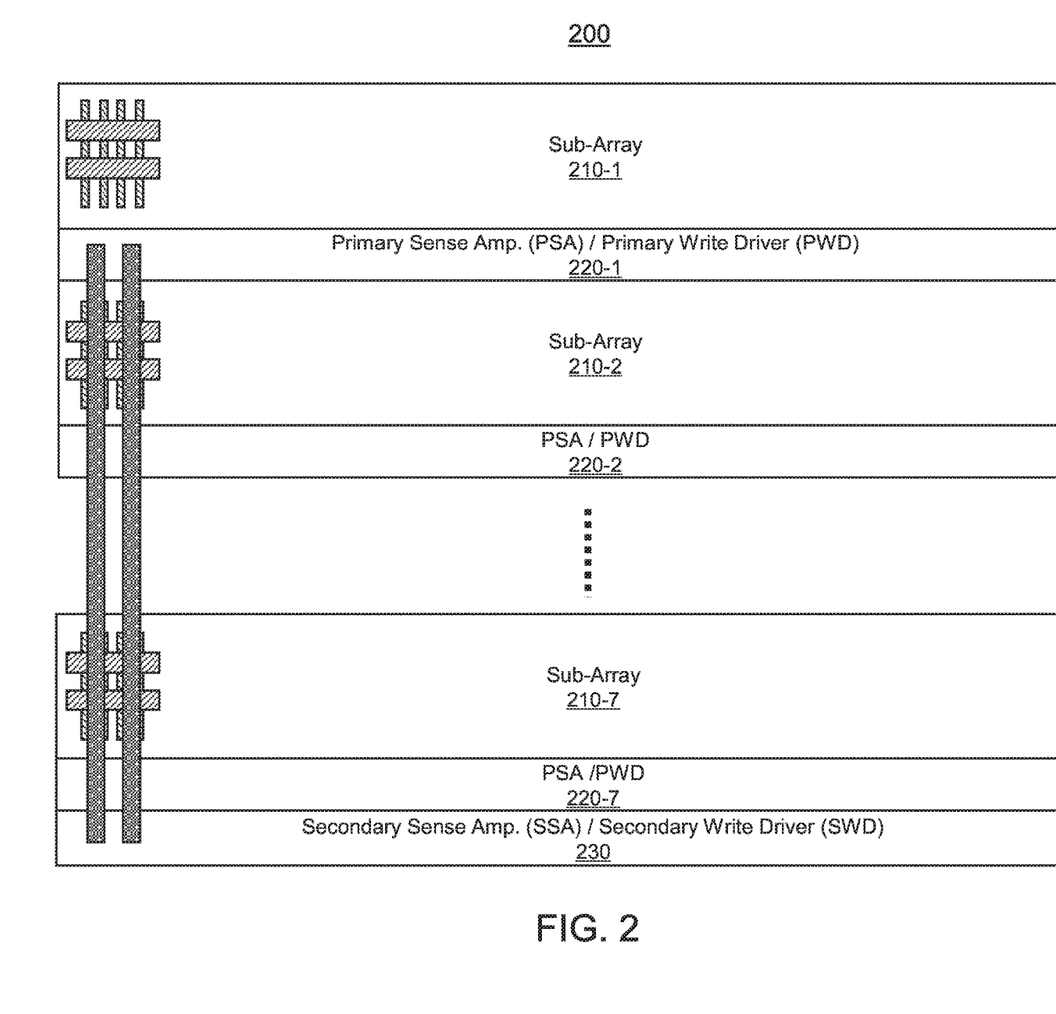
FIG. 2 is a block diagram of a memory device architecture, in accordance with an embodiment of the present invention.

With reference to FIG. 2, a memory architecture 200 is provided. As shown, the architecture 200 includes a plurality of sub-arrays 210-1 through 210-7. The sub-arrays 210-1 through 210-7 have respective memory cells allocated thereto. The memory architecture 200 further includes a plurality of primary sense amplifiers (PSAs)/primary write drivers (PWDs) 220-1 through 220-7 coupled to respective ones of the plurality of sub-arrays 210-1 through 210-7, and a secondary sense amplifier (SSA)/secondary write driver (SWD) 230. In this illustrative embodiment, the plurality of sub-arrays 210-1 through 210-7 share the SSA/SWD 230, and once a given one of the sub-arrays 210-1 through 210-7 is activated, then the corresponding one of the PSAs 220-1 through 220-7 can have its outputs driven to the SSA 230 through the DL. Memory cells selected by WLs in each sub-array 210-1 through 210-7 are read out.

In memory architectures like DRAM or SRAM, a read operation can be carried out by selecting 1 WL from 512×9 row addresses and 64 BL pairs from 2k×5 column addresses, and connecting the 64 BL pairs to 64 DL pairs via the PSA in the activated sub-array (e.g., 512 WL*2k BL). Generally, a portion of the data (e.g., 1/32 of the data) is transferred by column selection while the remaining data (e.g., 31/32 of the data) is wasted. Since there are total 2k BL pairs/PSAs, 2k data can be read simultaneously if the SSA 230 is working with a single-ended DL, which maximizes bandwidth and eliminates wasting data and power.

Examples of sense amplifiers that can implement the PSA and/or SSA of the memory architecture shown above in FIG. 2 will now be described with reference to FIGS. 3-6.

Figure 3:
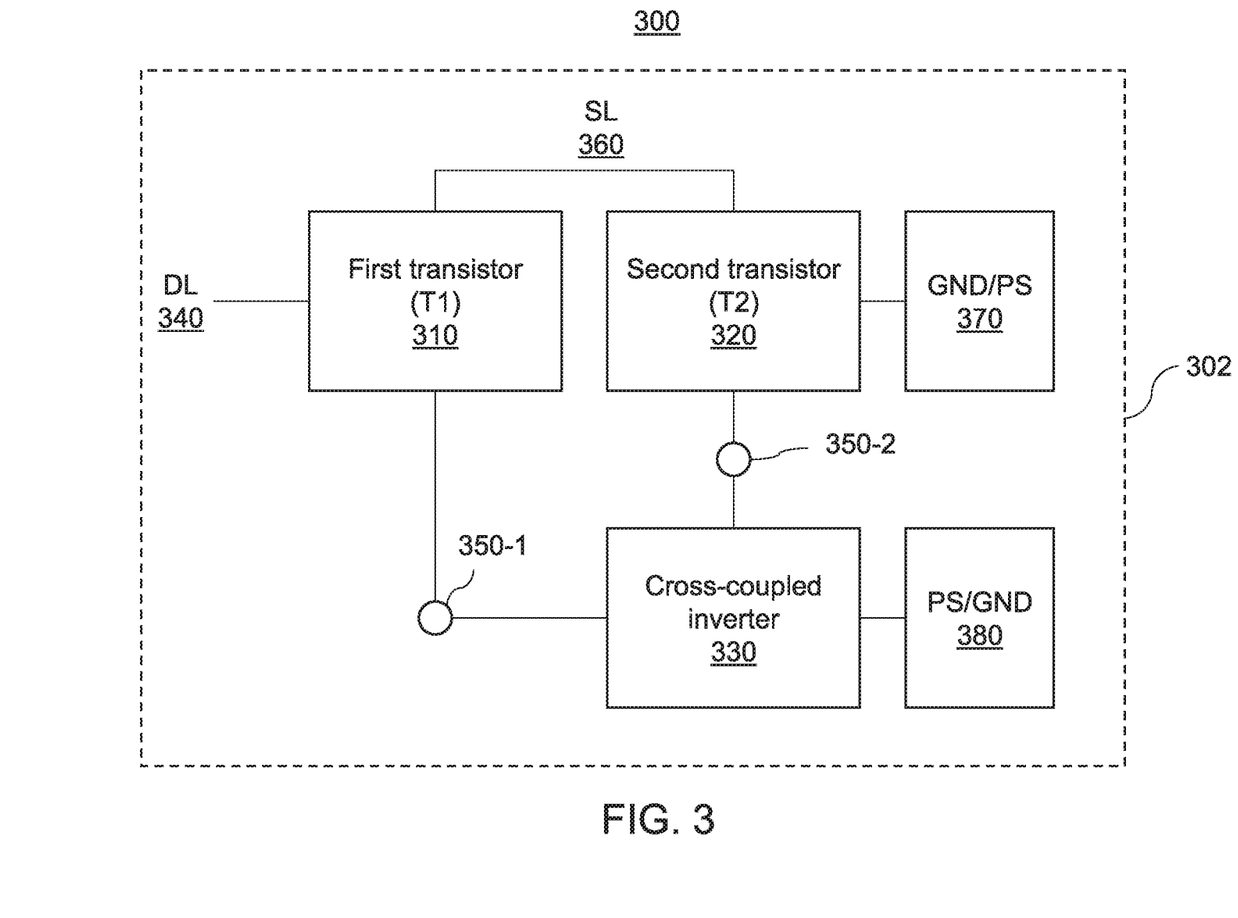
FIG. 3 is a block diagram of a portion of a sense amplifier, in accordance with an embodiment of the present invention.

With reference to FIG. 3, a block diagram is provided illustrating a portion 302 of a sense amplifier 300 including a first transistor (T1) 310, a second transistor (T2) 320 and a cross-coupled inverter 330.

T1 310 can be connected to a data line (DL) 340, a first node (N1) 350-1 and a setting line (SL) 360. For example, a source/drain of T1 310 can be connected to DL 350, a drain/source of T1 310 can be connected to N1 350-1, and a gate of T1 310 can be connected to SL 360. Further details regarding T1 310 will be described below with reference to FIGS. 4-7.

T2 320 can be connected to ground (GND) or power supply voltage (PS) 370, a second node (N2) 350-2 and SL 360. For example, a source/drain of T2 320 can be connected to GND/PS 370, a drain/source of T2 320 can be connected to N2 350-2 and a gate of T2 320 can be connected to SL 360. Further details regarding T2 320 will be described below with reference to FIGS. 4-7.

Cross-coupled inverter 330, which can include four transistors (not shown), can be connected to N1 350-1, N2 350-2 and PS/GND 380. For example, if T2 320 is connected to GND, then cross-coupled inverter 330 can be connected to PS. As another example, if T2 320 is connected to PS, then cross-coupled inverter 330 can be connected to GND. Further details regarding cross-coupled inverter 330 will be described below with reference to FIGS. 4-7.

FIG. 3 depicts an overview of a portion 302 of a sense amplifier 300. Additional components that are not shown in FIG. 3, such as, e.g., other transistors and nodes, can be included within the sense amplifier 300. For example, in some embodiments, the sense amplifier 300 can include nine transistors. In other embodiments, the sense amplifier 300 can include ten transistors. Exemplary sense amplifiers will now be described in further detail below with reference to FIGS. 4-7.

Figure 4:
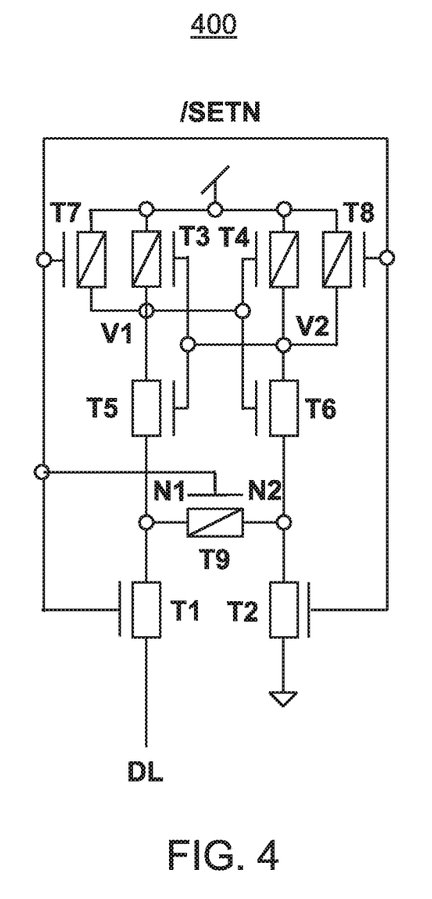
FIG. 4 is a schematic of a sense amplifier, in accordance with an embodiment of the present invention.

With reference to FIG. 4, a schematic of a sense amplifier 400 is provided in accordance with an embodiment of the present invention. Illustratively, the sense amplifier 400 can be implemented in a memory device. For example, the sense amplifier 400 can be implemented in, e.g., DRAM.

As shown, the sense amplifier 400 can include nine transistors T1-T9. In one embodiment, T1-T9 include field-effect transistors (FETs). In this illustrative example, T1, T2, T5 and T6 can include n-type FETs (NFETs), while T3, T4 and T7-T9 can include p-type FETs (PFETs). As will be described below with reference to FIG. 5, in an alternative embodiment, T1, T2, T5 and T6 can include PFETs, while T3, T4 and T7-T9 can include NFETs.

As further shown, T1 has a source/drain connected to a data line (DL), a drain/source connected to a first node (N1) and a gate connected to a setting line (/SETN), T2 has a source/drain connected to ground (GND) (0V), a drain/source connected to a second node (N2) and a gate connected to /SETN, T3 has a source/drain connected to a power supply voltage (VDD), a drain/source connected to a first output node (V1) and a gate connected to a second output node (V2), T4 has a source/drain connected to VDD, a drain/source connected to V2 and a gate connected to V1, T5 has a source/drain connected to N1, a drain/source connected to V1 and a gate connected to V2, T6 has a source/drain connected to N2, a drain/source connected to V2 and a gate connected to V1, T7 has a source/drain connected to VDD, a drain/source connected to V1 and a gate connected to /SETN, T8 has a source/drain connected to VDD, a drain/source connected to V2 and a gate connected to /SETN, and T9 has a source/drain connected to N1, a drain/source connected to N2 and a gate connected to /SETN.

The DL can be driven 0V at low and 0.2 V at high. The T1 current can be made larger when DL is low (0V) since N1/N2 are at VDD (e.g., 1.2V). The nodes N1/N2 are at NMOS threshold voltage (Vth) initially and the T1/T2 drain/source voltage (Vds) are the same and are used to make the T1 current larger when DL is high (0.2V) since the T1 Vds is lower to the T2 Vds, thereby generating the voltage difference between the nodes N1 and N2. The voltage difference between N1 and N2 is sensed and amplified by cross-coupled inverters formed by T3/T4/T5/T6. Thus, fully railed voltages can be achieved at the output nodes V1 and V2. /SETN is active high and activates the sense amplifier 400. When it is inactive, /SETN is low and thus T7/T8 are turned on, V1/V2 are set to 1.2V, N1/N2 go to NMOS threshold voltage (Vth) and T9 shorts N1/N2.

Figure 5:
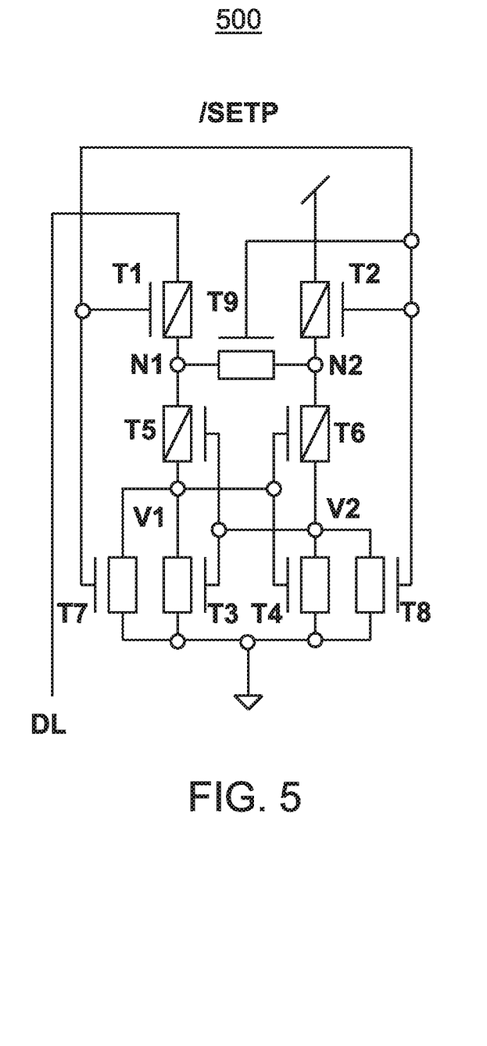
FIG. 5 is a schematic of a sense amplifier, in accordance with another embodiment of the present invention.

With reference to FIG. 5, a schematic of a sense amplifier 500 is provided in accordance with another embodiment of the present invention. Illustratively, the sense amplifier 500 can be implemented in a memory device. For example, the sense amplifier 500 can be implemented in, e.g., DRAM.

As shown, the sense amplifier 500 can include nine transistors T1-T9. In one embodiment, T1-T9 include field-effect transistors (FETs). In this illustrative example, T1, T2, T5 and T6 can include p-type FETs (PFETs), while T3, T4 and T7-T9 can include n-type FETs (NFETs). As described above with reference to FIG. 4, in an alternative embodiment, T1, T2, T5 and T6 can include NFETs, while T3, T4 and T7-T9 can include PFETs.

As further shown, T1 has a source/drain connected to a data line (DL), a drain/source connected to a first node (N1) and a gate connected to a setting line (/SETP), T2 has a source/drain connected to a power supply voltage (VDD), a drain/source connected to a second node (N2) and a gate connected to /SETP, T3 has a source/drain connected to ground (GND), a drain/source connected to a first output node (V1) and a gate connected to a second output node (V2), T4 has a source/drain connected to VDD, a drain/source connected to V2 and a gate connected to V1, T5 has a source/drain connected to N1, a drain/source connected to V1 and a gate connected to V2, T6 has a source/drain connected to N2, a drain/source connected to V2 and a gate connected to V1, T7 has a source/drain connected to GND, a drain/source connected to V1 and a gate connected to /SETP, T8 has a source/drain connected to GND, a drain/source connected to V2 and a gate connected to /SETP, and T9 has a source/drain connected to N1, a drain/source connected to N2 and a gate connected to /SETP.

The DL can be driven 1V at low and 1.2 V at high. Basically, in the FIG. 5 embodiment, the NMOS/GND (0V) of the sense amplifier 400 of FIG. 4 is replaced by PMOS/VDD (1.2V). The T1 current can be made larger when DL is low (0V) since N1/N2 are at PMOS threshold voltage (Vth) initially and the T1/T2 drain/source voltage (Vds) are the same and are used to make the T1 current larger when DL is high (1.2V) since the T1 Vds is lower to the T2 Vds, thereby generating the voltage difference between the nodes N1 and N2. The voltage difference between N1 and N2 is sensed and amplified by cross-coupled inverters formed by T3/T4/T5/T6. Thus, fully railed voltages can be achieved at the output nodes V1 and V2. /SETP is active high and activates the sense amplifier 500. When it is inactive, /SETP is low and thus T7/T8 are turned on, V1/V2 are set to 1.2V, N1/N2 go to PMOS Vth, and T9 shorts N1/N2.

The sense amplifiers 400 and 500 shown in FIGS. 4 and 5, respectively, do not require a reference voltage (Vref) generator circuit. Additionally, the DL voltage amplitude can be ⅙ (0.2V) from ⅓ (0.4V) to VDD (1.2V).

Figure 6:
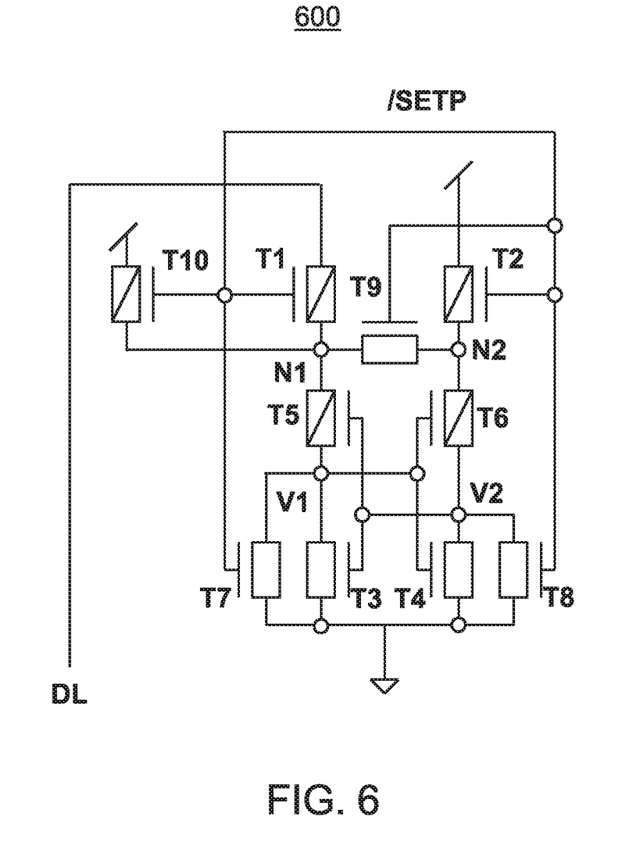
FIG. 6 is a schematic of a sense amplifier, in accordance with yet another embodiment of the present invention.

With reference to FIG. 6, a schematic of a sense amplifier 600 is provided in accordance with an embodiment of the present invention. Illustratively, the sense amplifier 600 can be implemented in a memory device. For example, the amplifier 600 can be implemented in, e.g., DRAM.

In contrast to the sense amplifiers described above with reference to FIGS. 4 and 5, the sense amplifier 600 is shown including ten transistors T1-T10. In this illustrative example, T1, T2, T5, T6 and T10 can include p-type FETs (PFETs), while T3, T4 and T7-T9 can include n-type FETs (NFETs). However, in another embodiment, T1, T2, T5, T6 and T10 can include NFETs, while T3, T4 and T7-T9 can include PFETs.

As further shown, T1 has a source/drain connected to a data line (DL), a drain/source connected to a first node (N1) and a gate connected to a setting line (/SETP), T2 has a source/drain connected to a power supply voltage (VDD), a drain/source connected to a second node (N2) and a gate connected to /SETP, T3 has a source/drain connected to ground (GND), a drain/source connected to a first output node (V1) and a gate connected to a second output node (V2), T4 has a source/drain connected to VDD, a drain/source connected to V2 and a gate connected to V1, T5 has a source/drain connected to N1, a drain/source connected to V1 and a gate connected to V2, T6 has a source/drain connected to N2, a drain/source connected to V2 and a gate connected to V1, T7 has a source/drain connected to GND, a drain/source connected to V1 and a gate connected to /SETP, T8 has a source/drain connected to GND, a drain/source connected to V2 and a gate connected to /SETP, T9 has a source/drain connected to N1, a drain/source connected to N2 and a gate connected to /SETP, and T10 has a source/drain connected to VDD, a drain/source connected to N1 and a gate connected to /SETP. Accordingly, the sense amplifier 600 shown in FIG. 6 is to similar to the sense amplifier 500 shown in FIG. 5, with an additional transistor T10.

In the embodiment in which T1, T2, T5, T6 and T10 can be NFETs, while T3, T4 and T7-T9 can be PFETs, T1 can have a source/drain connected to a data line (DL), a drain/source connected to a first node (N1) and a gate connected to a setting line (/SETN), T2 can have a source/drain connected to ground (GND) (0V), a drain/source connected to a second node (N2) and a gate connected to /SETN, T3 can have a source/drain connected to a power supply voltage (VDD), a drain/source connected to a first output node (V1) and a gate connected to a second output node (V2), T4 can have a source/drain connected to VDD, a drain/source connected to V2 and a gate connected to V1, T5 can have a source/drain connected to N1, a drain/source connected to V1 and a gate connected to V2, T6 can have a source/drain connected to N2, a drain/source connected to V2 and a gate connected to V1, T7 can have a source/drain connected to VDD, a drain/source connected to V1 and a gate connected to /SETN, T8 can have a source/drain connected to VDD, a drain/source connected to V2 and a gate connected to /SETN, T9 can have a source/drain connected to N1, a drain/source connected to N2 and a gate connected to /SETN, and T10 can have a source/drain connected to GND, a drain/source connected to N1 and a gate connected to /SETN. Accordingly, a sense amplifier similar to the sense amplifier 400 of FIG. 4 can be realized, with an additional transistor T10.

The tenth transistor T10 can prevent floating situations resulting from the pre-charging of the DL at VDD/GND.

Figure 7:
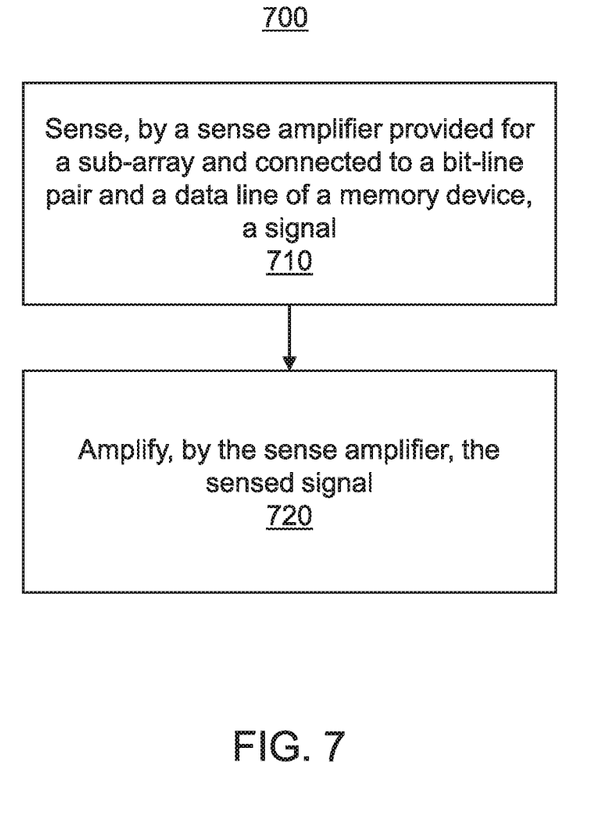
FIG. 7 is a block/flow diagram of a system/method for implementing a sense amplifier, in accordance with an embodiment of the present invention.

With reference to FIG. 7, a block/flow diagram is provided illustrating a system/method 600 for implementing a sense amplifier. The system/method 700 can be performed to improve (e.g., maximize) bandwidth to read sense amplifier outputs, and eliminates wasting data and power.

At block 710, a signal is sensed by a sense amplifier provided for a sub-array and connected to a bit-line pair and a data line of a memory device. The signal can be a low power signal received from the bit-line that represents a data bit (e.g., 1 or 0) stored in a memory cell. For example, the sense amplifier can be, e.g., a primary sense amplifier or a secondary sense amplifier.

The sense amplifier can include a first transistor having a source/drain connected to a data line, a drain/source connected to a first node and a gate connected to a setting line, a second transistor having a source/drain connected to ground or a power supply voltage, a drain/source connected to a second node and a gate connected to the setting line The sense amplifier can further include a cross-coupled inverter. More specifically, the cross-coupled inverter can include a third transistor having source/drain connected to the power supply voltage or ground, a drain/source connected to a first output node and a gate connected to a second output node, a fourth transistor having a source/drain connected to the power supply voltage or ground, a drain/source connected to the second output node and a gate connected to the first output node, a fifth transistor having a source/drain connected to the first node, a drain/source connected to the first output node and a gate connected to the second output node, and a sixth transistor having a source/drain connected to the second node, a drain/source connected to the second output node and a gate connected to the first output node.

The sense amplifier can further include a seventh transistor having a source/drain connected to the power supply voltage or ground, a drain/source connected to the first output node and a gate connected to the setting line, an eighth transistor having a source/drain connected to the power supply voltage or ground, a drain/source connected to the second output node and a gate connected to the setting line, and a ninth transistor having a source/drain connected to the first node, a drain/source connected to the second node and a gate connected to the setting line.

In some embodiments, the sense amplifier can further include a tenth transistor having a source/drain connected to the power supply voltage or ground, a drain/source connected to the first node and a gate connected to the setting line.

Further details regarding the sense amplifier are described above with reference to FIGS. 1-5.

At block 720, the sensed signal is amplified by the sense amplifier. More specifically, the cross-coupled inverter can be configured to amplify the sensed signal. The amplification can be performed so that the signal can be interpreted by logic outside of the memory.

Having described preferred embodiments of sense amplifiers for wider I/O memory devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A sense amplifier, comprising:
a first transistor having a source/drain connected to a data line, a drain/source connected to a first node and a gate connected to a setting line;
a second transistor having a source/drain directly connected to ground, a drain/source connected to a second node and a gate connected to the setting line;
a cross-coupled inverter connected to a first output node, a second output node, and the first and second nodes; and
a connecting transistor connecting the first and second nodes, the connecting transistor having a source/drain connected to the first node, a drain/source connected to the second node and a gate connected to the setting line.

2. The sense amplifier of claim 1, wherein the cross-coupled inverter includes:
a third transistor having source/drain connected to a power supply voltage, a drain/source connected to the first output node and a gate connected to the second output node;
a fourth transistor having a source/drain connected to the power supply voltage, a drain/source connected to the second output node and a gate connected to the first output node;
a fifth transistor having a source/drain connected to the first node, a drain/source connected to the first output node and a gate connected to the second output node; and
a sixth transistor having a source/drain connected to the second node, a drain/source connected to the second output node and a gate connected to the first output node.

3. The sense amplifier of claim 2, further comprising:

a seventh transistor having a source/drain connected to the power supply voltage, a drain/source connected to the first output node and a gate connected to the setting line; and
an eighth transistor having a source/drain connected to the power supply voltage, a drain/source connected to the second output node and a gate connected to the setting line.

4. The sense amplifier of claim 3, wherein:
the first transistor includes an n-type field-effect transistor (NFET);
the second transistor includes an NFET;
the third transistor includes a p-type FET (PFET);
the fourth transistor includes a PFET;
the fifth transistor includes an NFET;
the sixth transistor includes an NFET;
the seventh transistor includes a PFET;
the eighth transistor includes a PFET; and
the connecting transistor includes a PFET, the connecting transistor corresponding to a ninth transistor.

5. The sense amplifier of claim 4, further comprising a tenth transistor including an NFET having a source/drain connected to the ground, a drain/source connected to the first node and a gate connected to the setting line.

6. A method for implementing a sense amplifier, comprising:
sensing, by a sense amplifier provided for a sub-array and connected to a bit-line pair and a data line of a memory device, a signal; and
amplifying, by the sense amplifier, the sensed signal;
wherein the sense amplifier includes:
a first transistor having a source/drain connected to a data line, a drain/source connected to a first node and a gate connected to a setting line;
a second transistor having a source/drain directly connected to a potential source, a drain/source connected to a second node and a gate connected to the setting line;
a cross-coupled inverter connected to a first output node, a second output node, and the first and second nodes; and
a connecting transistor connecting the first and second nodes, the connecting transistor having a source/drain connected to the first node, a drain/source connected to the second node and a gate connected to the setting line.

7. The method of claim 6, wherein the potential source is ground, and the cross-coupled inverter further includes:
a third transistor having source/drain connected to a power supply voltage, a drain/source connected to the first output node and a gate connected to the second output node;
a fourth transistor having a source/drain connected to the power supply voltage, a drain/source connected to the second output node and a gate connected to the first output node;
a fifth transistor having a source/drain connected to the first node, a drain/source connected to the first output node and a gate connected to the second output node; and
a sixth transistor having a source/drain connected to the second node, a drain/source connected to the second output node and a gate connected to the first output node.

8. The method of claim 7, wherein the sense amplifier further includes:

a seventh transistor having a source/drain connected to the power supply voltage, a drain/source connected to the first output node and a gate connected to the setting line; and an eighth transistor having a source/drain connected to the power supply voltage, a drain/source connected to the second output node and a gate connected to the setting line.

9. The method of claim 8, wherein:
the first transistor includes an n-type field-effect transistor (NFET);
the second transistor includes an NFET;
the third transistor includes a p-type FET (PFET);
the fourth transistor includes a PFET;
the fifth transistor includes an NFET;
the sixth transistor includes an NFET;
the seventh transistor includes a PFET;
the eighth transistor includes a PFET; and
the connecting transistor includes a PFET, the bridge transistor corresponding to a ninth transistor.

10. The method of claim 9, wherein the sense amplifier further includes a tenth transistor including an NFET having a source/drain connected to the ground, a drain/source connected to the first node and a gate connected to the setting line.

11. The method of claim 6, wherein the potential source is a power supply voltage, and the cross-coupled inverter includes:
a third transistor having a source/drain connected to ground, a drain/source connected to the first output node and a gate connected to the second output node;
a fourth transistor having a source/drain connected to ground, a drain/source connected to the second output node and a gate connected to the first output node;
a fifth transistor having a source/drain connected to the first node, a drain/source connected to the first output node and a gate connected to the second output node; and
a sixth transistor having a source/drain connected to the second node, a drain/source connected to the second output node and a gate connected to the first output node.

12. The method of claim 11, further comprising:
a seventh transistor having a source/drain connected to ground, a drain/source connected to the first output node and a gate connected to the setting line; and
an eighth transistor having a source/drain connected to ground, a drain/source connected to the second output node and a gate connected to the setting line.

13. The method of claim 12, wherein:
the first transistor includes a p-type FET (PFET);
the second transistor includes a PFET having a source/drain connected to the power supply voltage;
the third transistor includes an n-type FET (NFET);
the fourth transistor includes an NFET;
the fifth transistor includes a PFET;
the sixth transistor includes a PFET;
the seventh transistor includes an NFET;
the eighth transistor includes an NFET; and
the connecting transistor includes an NFET, the connecting transistor corresponding to a ninth transistor.

14. The method of claim 13, further comprising a tenth transistor including a PFET having a source/drain connected to the power supply voltage, a drain/source connected to the first node and a gate connected to the setting line.

15. A sense amplifier, comprising:
a first transistor having a source/drain connected to a data line, a drain/source connected to a first node and a gate connected to a setting line;
a second transistor having a source/drain directly connected to a power supply voltage, a drain/source connected to a second node and a gate connected to the setting line;
a cross-coupled inverter connected to a first output node, a second output node, and the first and second nodes; and
a connecting transistor having a source/drain connected to the first node, a drain/source connected to the second node and a gate connected to the setting line.

16. The sense amplifier of claim 15, wherein the cross-coupled inverter includes:
a third transistor having a source/drain connected to ground, a drain/source connected to the first output node and a gate connected to the second output node;
a fourth transistor having a source/drain connected to ground, a drain/source connected to the second output node and a gate connected to the first output node;
a fifth transistor having a source/drain connected to the first node, a drain/source connected to the first output node and a gate connected to the second output node; and
a sixth transistor having a source/drain connected to the second node, a drain/source connected to the second output node and a gate connected to the first output node.

17. The sense amplifier of claim 16, further comprising:
a seventh transistor having a source/drain connected to ground, a drain/source connected to the first output node and a gate connected to the setting line; and
an eighth transistor having a source/drain connected to ground, a drain/source connected to the second output node and a gate connected to the setting line.

18. The sense amplifier of claim 17, wherein:
the first transistor includes a p-type FET (PFET);
the second transistor includes a PFET having a source/drain connected to the power supply voltage;
the third transistor includes an n-type FET (NFET);
the fourth transistor includes an NFET;
the fifth transistor includes a PFET;
the sixth transistor includes a PFET;
the seventh transistor includes an NFET;
the eighth transistor includes an NFET; and
the connecting transistor includes an NFET, the connecting transistor corresponding to a ninth transistor.

19. The sense amplifier of claim 18, further comprising a tenth transistor including a PFET having a source/drain connected to the power supply voltage, a drain/source connected to the first node and a gate connected to the setting line.

* * * * *